United States Patent [19]

Harris et al.

[11] Patent Number: 5,414,458
[45] Date of Patent: May 9, 1995

[54] SEMICONDUCTOR DEVICE LEAD INSPECTION SYSTEM

[75] Inventors: Charles K. Harris, Dallas; Joseph F. Borchard, Garland; Robert H. Clunn, Richardson; James R. Maunder, Austin; Walter E. Marrable, Dallas, all of Tex.

[73] Assignee: Texas Instruments Incorporated, Dallas, Tex.

[21] Appl. No.: 43,333

[22] Filed: Apr. 6, 1993

[51] Int. Cl.⁶ .............................................. H04N 7/18
[52] U.S. Cl. ...................................... 348/92; 348/126
[58] Field of Search .................. 348/87, 92, 126, 132, 348/36; 382/8; 356/390; 359/629, 633, 638, 639, 640, 795, 711, 717

[56] References Cited

U.S. PATENT DOCUMENTS

| | | | |
|---|---|---|---|
| 3,932,702 | 1/1976 | Shelley et al. | 348/36 |
| 4,272,684 | 6/1981 | Seachman | 359/629 |
| 4,305,658 | 12/1981 | Yoshida | 348/132 |
| 4,509,081 | 4/1985 | Peyton et al. | 348/132 |

*Primary Examiner*—Howard W. Britton
*Assistant Examiner*—A. Au
*Attorney, Agent, or Firm*—Warren L. Franz; Wade James Brady, III; Richard L. Donaldson

[57] ABSTRACT

An inspection system utilizes an image doubler design that includes a plurality of mirrors that effectively folds the object distance by reflecting the image along a folded path. Strobed illumination is used in conjunction with a shutterless camera. Increased image resolution results from an optional anamorphic lens with vertical magnification. The lens assembly includes concentric toroidal lens that are produced from a single piece of machineable optical material.

9 Claims, 2 Drawing Sheets

SEMICONDUCTOR DEVICE LEAD INSPECTION SYSTEM

FIELD OF THE INVENTION

This invention relates to semiconductor devices, and more particularly to an improved image system used in inspecting the leads on semiconductor devices.

BACKGROUND OF THE INVENTION

In testing and mounting semiconductor devices, it is necessary that the leads of the device be correctly positioned and that the ends of leads lie in a common plane. This is particularly true for surface-mount devices. The leads of the semiconductor device may be bent sideways, out, in or down, thereby moving the end of the pin from a plane common with the ends of the other pins. In some instances, one or more pins may have a greater height than the others.

Existing planarity inspection equipment is either not cost-effective or performs the inspection "off-line" as in a quality control operation. The hardware required for off-line inspection is inexpensive, however, the inspection is done manually, lead-by lead, making 100% inspection time-consuming as, well as labor cost prohibitive. Automatic equipment which can be used for on-line inspection is actually stand-alone equipment integrated with the other processing equipment.

SUMMARY OF THE INVENTION

An inspection system utilizes an image doubler design that includes a plurality of mirrors that effectively folds the object distance by reflecting the image along a folded path. Increased image resolution results from an optional anamorphic lens assembly including concentric toroidal lens that is produced from a single piece of machinable optical material. The optional lens provides a greater vertical magnification while maintaining the same horizontal size.

The split image is produce on a shutterless full frame, high resolution camera by attenuating background illumination and strobing a light emitting diode illuminator. The duration of the strobe is controlled by a vision computer on which the viewed object is displayed.

The inspection system is usable for inspecting leads on semiconductor devices, and includes an inspection station for holding a device to be inspected, a strobed source of illumination adjacent to said device being inspected for illuminating the device, a shutterless viewing camera for receiving an image of the device being inspected, an optical system having a folded optical path on a side of said device opposite said source of illumination for directing a split image of the device being inspected to said viewing camera, and a display device for displaying the split image of said device being inspected.

The optional concentric toroidal anamorphic lens system has four aspheric surfaces forming two lenses and a support member holding said two lenses in spaced apart positions. In one plane, the first of said two lenses has two concave surfaces and a second of said two lenses has a concave surface and a convex surface. The lens assembly is concentric in the other (orthogonal) plane, that is the four surfaces of the two lenses are cut on the radii extending from a common axis. This allows the system to be easily fabricated out of one piece of machinable optical material on a diamond point turning lathe with one setup. In addition, because of the concentric design, multiple systems can be recut at the same time with one setup.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
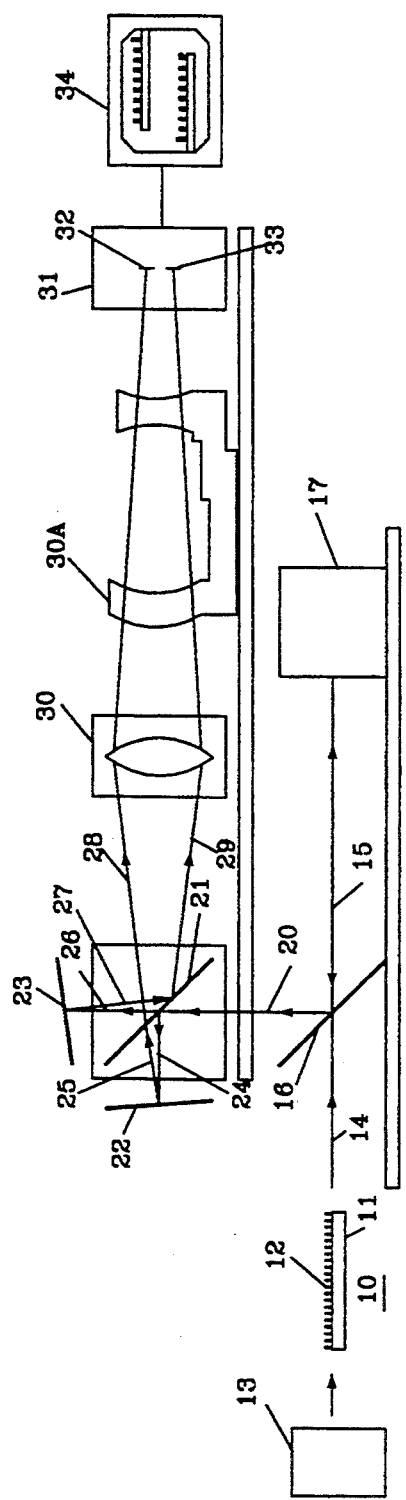
FIG. 1 illustrates a folded optical path and the related components usable in the inspection system of the present invention.

FIG. 1 shows the optical path and components for the component lead inspection system. A semiconductor device 10 having body 11 and a plurality of leads is placed in front of an illumination system 13. The illuminated image is viewed by camera 31 along path 14, to mirror assembly 17, is reflected back along path 15 to mirror 16 and reflected at a 45-degree angle along path 20 to mirror/beam splitter 21.

When the image impinges on mirror/beam splitter 21, the image is reflected via path 24 to reflector 22, and back along path 25, through mirror/beam splitter 21, along path 28 to lens assembly 30, and then to camera 31.

The image passes through mirror/beam splitter 21, along path 26 to reflector 23, back along path 27 to mirror/beam splitter 21 and is reflected along path 29 to lens assembly 30 where it is focused on camera 31. It should be noted that during the splitting of the image at mirror/beam splitter 21, the two duplicate images are formed by splitter 21 are separated vertically such that image 32 and image 33 are vertically and horizontally spaced and horizontally shifted from each other at camera 31. Mirrors 22, 23 are adjustably tiltable mirrors, and vertical and horizontal spacing of the two images is controlled by tilting mirrors 22, 23 relative to the split optical beam paths.

An optional lens 30a may be used to provide better resolution at a greater vertical magnification. Lens 30a is described in more detail with reference to FIG. 4.

Camera 31 is, for example, a full frame high resolution type camera such as the Kodak "MegaPlus" camera, having improved reliability with the shutter removed. There is no need for an electro-mechanical shutter since the illumination source 13 is strobed at a rate to match that of the computer controlled image display system, presenting a continuous image of the device 10. Camera 31 is connected to a computer controlled viewing device 34. Camera 31 has a known scanning and frame rate, and source 13 is synchronized with the camera scanning and frame rate to provide a stable image in the viewing device.

Figure 2:
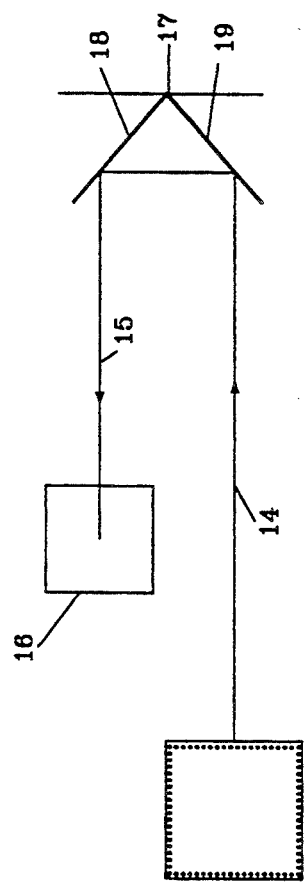
FIG. 2 is a top view of part of the optical path.

FIG. 2 is a top view of the optical path represented by paths 14 and 15, and mirror assembly 17. Device 10 is in front of illumination source 13. An image of device 10 is directed along path 14 to mirror assembly 17.

Mirror assembly 17 includes two mirrors 18 and 19 positioned at a 90-degree angle with respect to each other, to redirect the image of device 10 through a 180-degree angle. The image impinges on mirror 19, is reflected to mirror 18, and in turn is reflected along path 15 to mirror 16. Mirror 16 is positioned at a 45-degree angle from the horizontal plane, as illustrated in FIG. 1.

Figure 3:
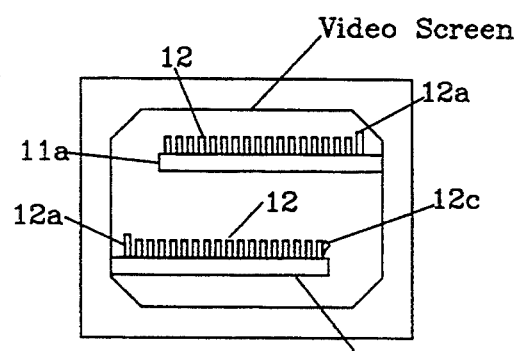
FIG. 3 shows a displayed device as viewed in the inspection system.

FIG. 3 represents the image of the semiconductor device being inspected, as displayed on a video monitor. The image is split and the two parts are vertically displaced from each other as described with reference to FIG. 2. Actually, the two images present the opposite ends, 11a and 11b, of one side of the semiconductor device 11. There is overlap of contacts 12 in the two images, but by splitting the image into two parts, a larger and clearer image of the leads 12 is possible. Using the split image allows better utilization of the high resolution camera imager which normally has a 3:4 or square aspect ratio. As pointed out above, additional vertical resolution may be obtained using optional lens 30a. As an example of an improper length lead, lead 12a is shown longer than the other leads. Lead 12c is shown bent outward so that it is not in line with the other leads along the side of the semiconductor device. The inspection will show bent leads, leads that are too short, too long, or otherwise improperly positioned.

Figure 4:
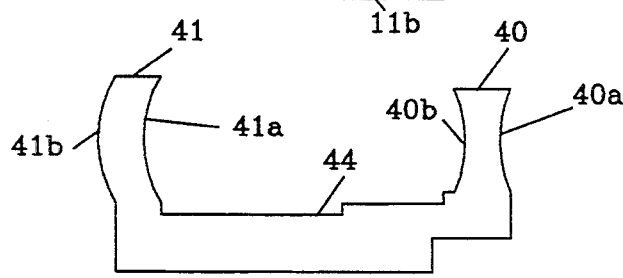
FIG. 4 is a side view of an anamorphic concentric toroidal lens assembly.
Figure 5:
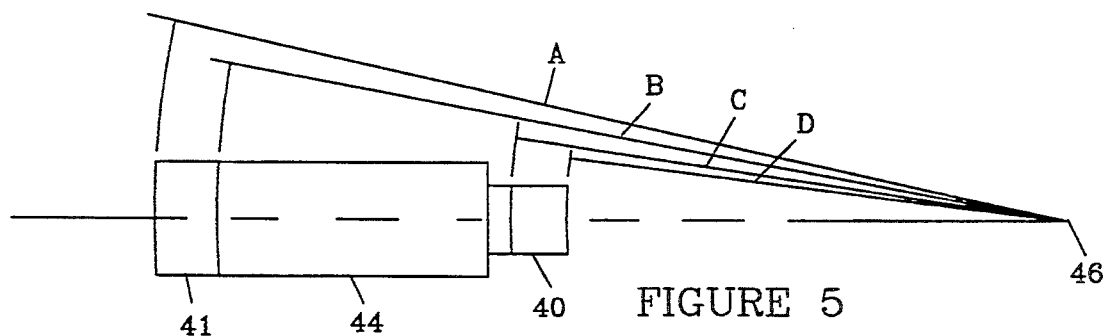
FIG. 5 is a top view of the lens assembly of FIG. 4.

FIG. 4 is a side view of lens assembly 30a. Lens assembly 30a is a concentric toroidal anamorphic lens that utilizes aspheric surfaces to form two spaced apart lens 40 and 41. Lenses 40 has two concave surfaces 40a and 40b in the same plane. Lens 41 has a concave surface 41a and a convex surface 41b. The two lenses are spaced apart by support member 44. Lens assembly 30a is a single piece of acrylic plastic. The lens assembly is concentric in the other (orthogonal) plane about an axis perpendicular to this plane and lends itself to Diamond Point fabrication processes. The four surfaces of the two lenses are cut on the radii A, B, C and D from point 46. FIG. 5 shows the radii A, B, C and D and point 46.

What is claimed:

1. A method for inspecting leads of a surface-mounted semiconductor device; said device having a side with opposite, first and second ends and a plurality of said leads on said side; and the method comprising:
    placing said device at an inspection station;
    illuminating said side of said placed device with background illumination;
    viewing said background illuminated side with a camera, through an optical system having a beam splitter for separating a viewed image of said side into first and second duplicate images;
    tilting mirrors to cause relative horizontal and vertical shifting of said first and second duplicate images; and
    displaying different parts of said shifted first and second duplicate images on a viewing device in a field of view, with said first end of said device side appearing in a displayed part of said first duplicate image, and said second end of said device side appearing in a displayed part of said second duplicate image, and the displayed parts of both duplicate images covering all of said device side when considered in totality.

2. A method as defined in claim 1, further comprising the step of vertically magnifying said duplicate images using a concentric toroidal anamorphic lens.

3. A method as defined in claim 2, further comprising the step of forming said anamorphic lens by cutting a single piece of light transparent solid material along four arcuate paths of different radii about a common axis.

4. A method as defined in claim 3, wherein, in said viewing step, said image is viewed using a shutterless, full frame camera; and, wherein, in said illuminating step, said side is background-illuminated using a light source which is strobed in synchronism with a scanning and frame rate of said viewing device, so that said display on said viewing device is continuous.

5. Apparatus for inspecting leads of a surface-mounted semiconductor device, comprising:
    an inspection station for holding a device to be inspected, said station having a front and back;
    a source of non-continuous, strobed illumination located in back of said inspection station;
    a shutterless, full frame viewing camera having a field of view; and
    an optical system positioned for directing an image viewed from said front of said inspection station to said viewing camera;
    said optical system including a beam splitter positioned for separating said viewed image into first and second duplicate images, and adjustably tiltable mirrors positioned relative to said beam splitter to cause relative horizontal and vertical shifting of said duplicate images, so that said field of view encompasses different parts of said shifted first and second duplicate images; and a concentric toroidal anamorphic lens positioned to vertically magnify said duplicate images.

6. Apparatus as defined in claim 5, wherein said lens comprises a one-piece element having four aspheric surfaces defining two lenses, and a support member holding said two lenses in spaced position relative to an optical beam path.

7. Apparatus as defined in claim 6, wherein said surfaces comprise coplanar arcs of different radii which are concentric about a common axis.

8. Apparatus as defined in claim 7, wherein said surfaces defining one of said lenses are concave surfaces, and wherein said surfaces defining the other of said lenses are respectively concave and convex surfaces.

9. Apparatus as defined in claim 8, wherein said optical system further includes other mirrors arranged to provide a folded optical beam path.

* * * * *